United States Patent
Kondou et al.

(10) Patent No.: US 7,351,096 B2
(45) Date of Patent: Apr. 1, 2008

(54) CABLE CONNECTOR

(75) Inventors: Takahiro Kondou, Shinagawa (JP);
Kiyoshi Sato, Shinagawa (JP); Mitsuru Kobayashi, Shinagawa (JP); Satoshi Moriyama, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 11/478,691

(22) Filed: Jul. 3, 2006

(65) Prior Publication Data

US 2007/0111597 A1    May 17, 2007

(30) Foreign Application Priority Data

Nov. 15, 2005 (JP) ............................. 2005-330472

(51) Int. Cl.
*H01R 12/24* (2006.01)
(52) U.S. Cl. ...................... 439/497; 439/494; 439/610
(58) Field of Classification Search ............... 439/493, 439/497, 495, 579, 610
See application file for complete search history.

(56) References Cited

U.S. PATENT DOCUMENTS

| | | | |
|---|---|---|---|
| 4,806,107 A * | 2/1989 | Arnold et al. ................ 439/79 |
| 5,205,762 A * | 4/1993 | Carney ........................ 439/607 |
| 6,336,827 B1 * | 1/2002 | Akama et al. .............. 439/610 |
| 6,482,028 B2 * | 11/2002 | Kumamoto et al. ........ 439/498 |
| 6,821,140 B2 * | 11/2004 | Wu ............................. 439/362 |
| 6,916,198 B2 * | 7/2005 | Wu et al. .................... 439/497 |
| 2003/0234447 A1 * | 12/2003 | Yunus et al. ................ 257/739 |
| 2004/0085488 A1 * | 5/2004 | Cho et al. ..................... 349/40 |
| 2004/0150105 A1 * | 8/2004 | Yunus et al. ................ 257/735 |

FOREIGN PATENT DOCUMENTS

JP    2003-059593    2/2003

* cited by examiner

*Primary Examiner*—Tho D. Ta
*Assistant Examiner*—Larisa Tsukerman
(74) *Attorney, Agent, or Firm*—Staas & Halsey LLP

(57) ABSTRACT

A cable connector includes a contact assembly including an electrical insulating block part which is configured to incorporate plural signal contacts; and a relay wiring substrate mounted to a back of the contact assembly. The relay wiring substrate includes, on a surface, a contact connecting pad electrically connected to one of the signal contacts, a wiring connecting pad, and a wiring pattern connecting the contact connecting pad and the wiring connecting pad. The relay wiring substrate further includes a ground layer inside the relay wiring substrate. The cable connector further includes a cable connected to the relay wiring substrate by electrically connecting an end of a wiring with the wiring connecting pad. The relay wiring substrate further includes a ground pattern for matching impedance inside the relay wiring substrate.

12 Claims, 21 Drawing Sheets

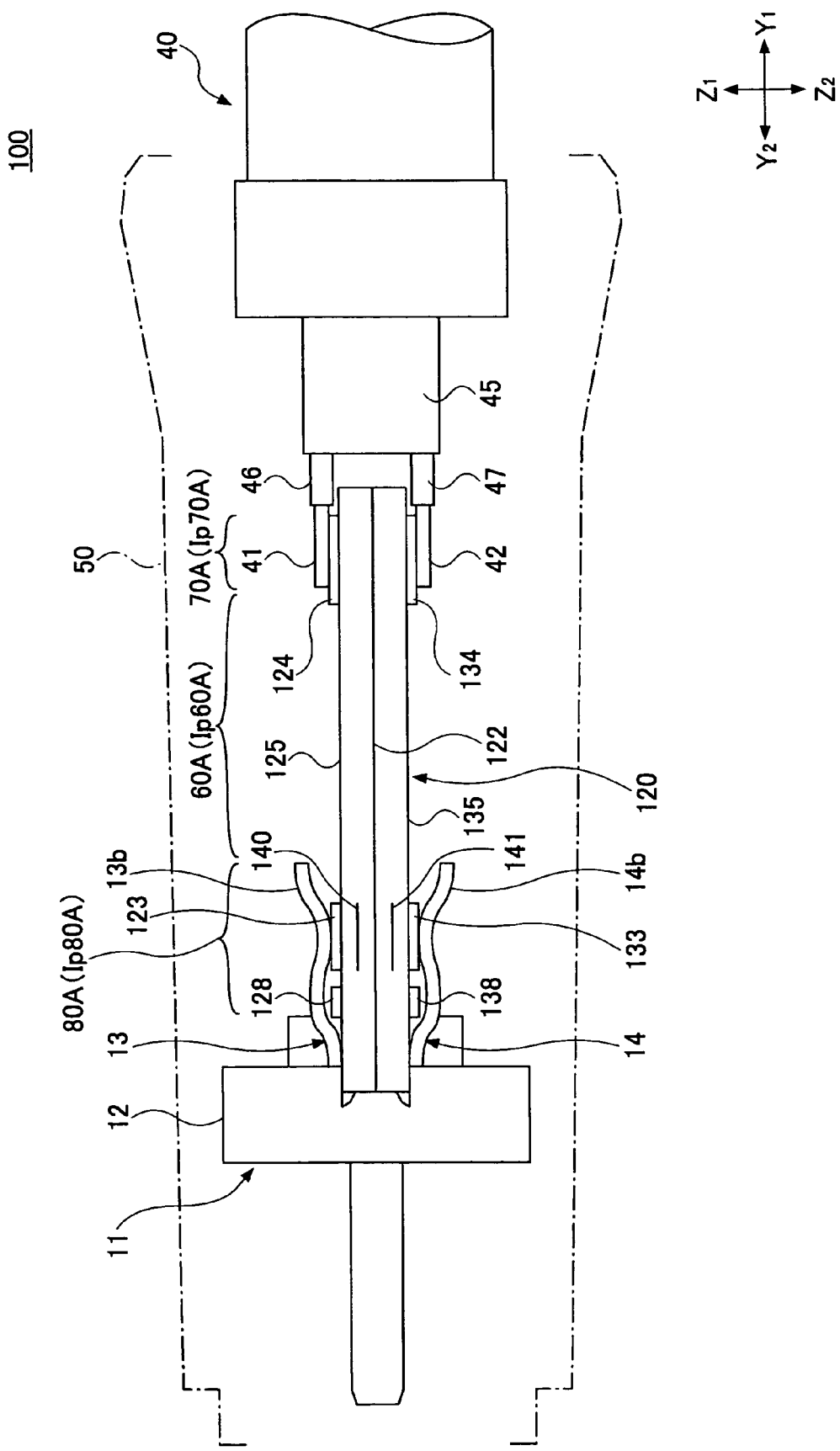

CABLE CONNECTOR

BACKGROUND OF THE INVENTION

1. Field of the Invention

The present invention generally relates to a cable connector, and more particularly, a cable connector for a balanced transmission having a relay wiring substrate in which a contact assembly is joined to the relay wiring substrate, and an end of a cable is connected to an end of the relay wiring substrate.

2. Description of the Related Art

As for methods of data transmission, for example, a normal transmission method is provided in which one wiring is used for each data signal. Further, a method of a balanced transmission is provided in which a pair of wirings are used for each data signal. Through the pair of wirings, a plus signal and a minus signal are simultaneously transmitted, which minus signal has the same size as the plus signal and a polarity reverse to the plus signal. The method of the balanced transmission has an advantage in that the balanced transmission is less susceptible to noise than the normal transmission method. Accordingly, the method of the balanced transmission has been adopted in fields where signals are transmitted at high speed.

As an industry standard, the impedance of a transmission path of the signal is a predetermined value, for example, 100 Ω. The transmission path of the signal includes the cable connector portion for balanced transmission in addition to the cable portion for balanced transmission. It is ideal that the impedance be equal to 100 Ω over the total length of the transmission path of the signal. Especially, in the case where the signal is transmitted at a high speed, a change of the impedance at even one part may adversely affect the signal.

Accordingly, as for the cable connector for balanced transmission, it is desirable that the change of the impedance at each part be as small as possible.

FIG. 1 is a view schematically illustrating a conventional cable connector 10 for balanced transmission disclosed in Japanese Laid-Open Patent Application Publication No. 2003-059593. FIG. 2 is a cross-sectional view illustrating a relay wiring substrate 20 and an enlarged part where the relay wiring substrate 20, the cable 40 for balanced transmission and a contact assembly 11 are connected together. FIGS. 3A and 3B are perspective views illustrating the relay wiring substrate 20. The lines X1-X2, Y1-Y2, and Z1-Z2 show a width direction, a length direction, and a height direction of the cable connector 10 for balanced transmission, respectively. Y1 shows a back direction, while Y2 shows a front direction thereof.

As for the cable connector 10 for balanced transmission, the relay wiring substrate (paddle card) 20 is connected to the back of the contact assembly 11. An end of the cable 40 of balanced transmission is connected to an end of the relay wiring substrate 20. The contact assembly 11, the relay wiring substrate 20, and a tip end of the cable 40 are covered by a shield housing 50.

The relay wiring substrate 20 has a two-layer structure sandwiching a ground layer 22 over an entire area between the two layers. As shown in FIG. 3A, the relay wiring substrate 20 further comprises, on an upper surface 21a thereof, a first contact connecting pad 23, a first wiring connecting pad 24, and a first wiring pattern 25 connecting the first contact connecting pad 23 and the first wiring connecting pad 24. As shown in FIG. 3B, the relay wiring substrate 20 further comprises, on an under surface 21b thereof, a second contact connecting pad 33, a second wiring connecting pad 34, a second wiring pattern 35 connecting the second contact connecting pad 33 and the second wiring connecting pad 34, and a second ground pattern 36. As shown in FIG. 2, a distance "A" between the ground layer 22 and each of the first and second contact connecting pads 23 and 33 is equal to a distance "B" between the ground layer 22 and each of the first and second wiring connecting pads 24 and 34. Returning to FIGS. 3A and 3B, first and second ground patterns 26 and 36 both have a comb shape. The first ground pattern 26 comprises first partitioning patterns 27 respectively extending between the first wiring patterns 25, and a first Y1 side connecting pattern 28 on the Y1 side extending in the X1-X2 direction for connecting an end of the respective first partitioning patterns 27 on the Y1 side. In the same manner, the second ground pattern 36 comprises second partitioning patterns 37 respectively extending between the second wiring patterns 35, and a second Y1 side connecting pattern 38 on the Y1 side extending in the X1-X2 direction for connecting an end of the second partitioning patterns 37 on the Y1 side.

As shown in FIG. 1, the cable connector 10 for the balanced transmission includes a section 60 where the first and second wiring patterns 25 and 35 are provided, a section 70 where the first and second wirings 41 and 42 are respectively soldered onto the first and second wiring connecting pads 24 and 34, and a section 80 where the first and second signal contacts 13 and 14 are respectively soldered onto the first and second contact connecting pads 23 and 33.

As for the section 60, the desired value of the impedance Ip60 is equal to 100 Ω.

As for the section 80, however, it is found that the impedance Ip80 is slightly greater than the desired value, i.e., 100 Ω in relation to a shape and a volume of the first and second finger portions 13b and 14b of the first and second signal contacts 13 and 14, which portions 13b and 14b are respectively soldered onto the first and second contact connecting pads 23 and 33.

In addition to this, as for the section 70, as shown by a circle "A" in the enlarged view of FIG. 2, it is found that corresponding parts of the first and second wirings 41 and 42 face the first and second Y1 side connecting patterns 28 and 38 so that the impedance Ip70 is slightly different from the desired value, i.e., 100 Ω. Namely, the first and second Y1 side connecting patterns 28 and 38 have an influence on the impedance Ip70.

SUMMARY OF THE INVENTION

Accordingly, it is a general object of the present invention to provide a cable connector in which one or more of the problems described above are obviated.

Another and more specific object of the present invention is to provide a cable connector configured to include a relay wiring substrate in which a transmission property at a part of the relay wiring substrate is improved.

In order to eliminate the above described problems, a preferred embodiment of the present invention provides a cable connector that includes a contact assembly including an electrical insulating block part which is configured to incorporate a plurality of signal contacts therein; and a relay wiring substrate mounted to a back of the contact assembly. The relay wiring substrate includes, on a surface thereof, a contact connecting pad electrically connected to one of the signal contacts, a wiring connecting pad, and a wiring pattern connecting the contact connecting pad and the wiring connecting pad. The relay wiring substrate further includes a ground layer inside the relay wiring substrate. The cable connector further includes a cable connected to the relay wiring substrate by electrically connecting an end of a wiring with the wiring connecting pad. The relay wiring substrate further includes a ground pattern for matching impedance inside the relay wiring substrate.

According to at least one embodiment of the present invention, the impedance of a section where a signal contact is connected to a contact connecting pad is matched to a predetermined value by a ground pattern for matching impedance so that a transmission property of a cable connector is improved.

BRIEF DESCRIPTION OF THE DRAWINGS

Other objects and further features of the present invention will be apparent from the following detailed description of preferred embodiments according to the present invention when read in conjunction with the accompanying drawings.

FIG. 4 is a view schematically showing a cable connector for balanced transmission according to a first embodiment of the present invention;

DESCRIPTION OF THE PREFERRED EMBODIMENTS

In the following, a description is given of preferred embodiments according to the present invention.

First Embodiment

Figure 5:
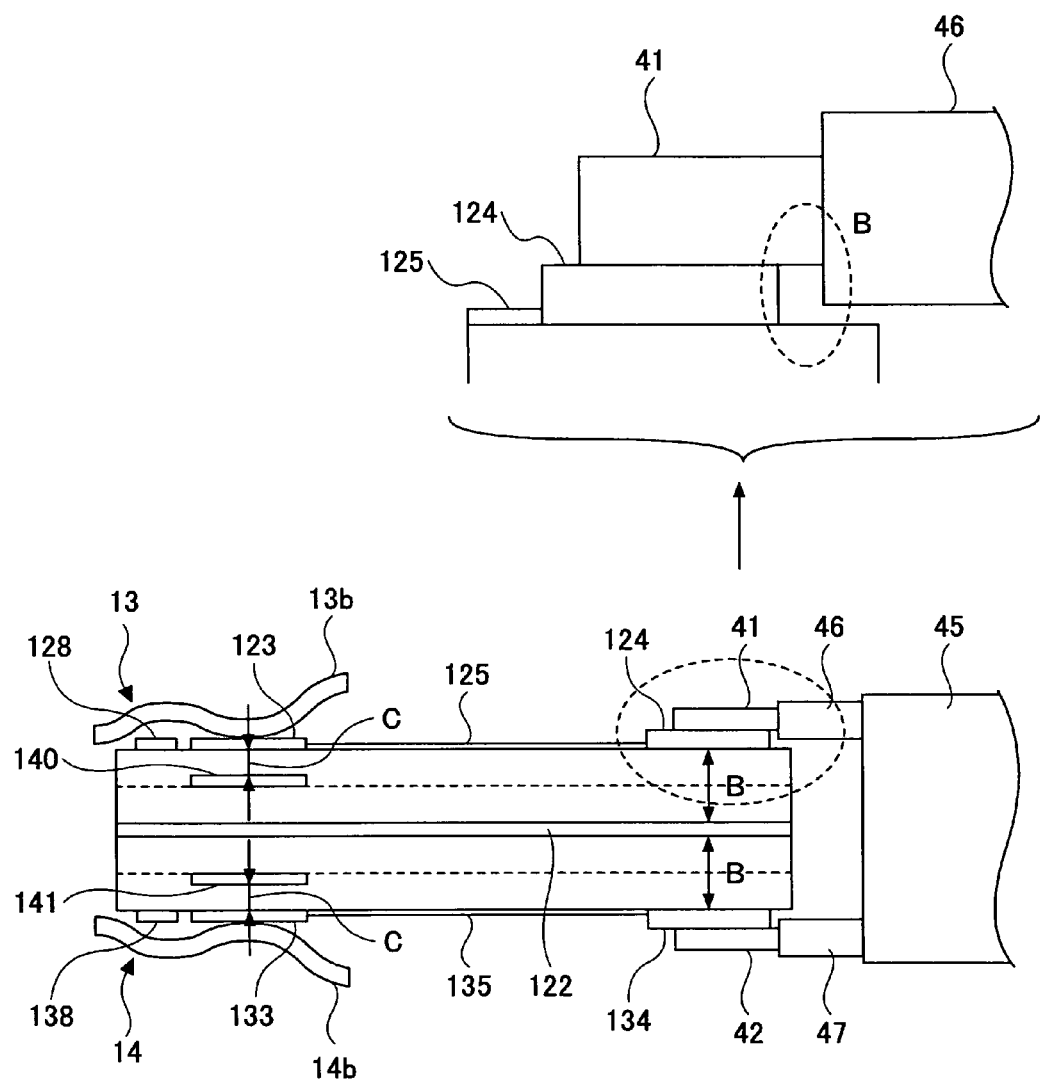
FIG. 5 is a schematic diagram of the relay wiring substrate and an enlarged part where the relay wiring substrate, the cable connector for the balanced transmission and the contact assembly are connected together.
Figure 6A:
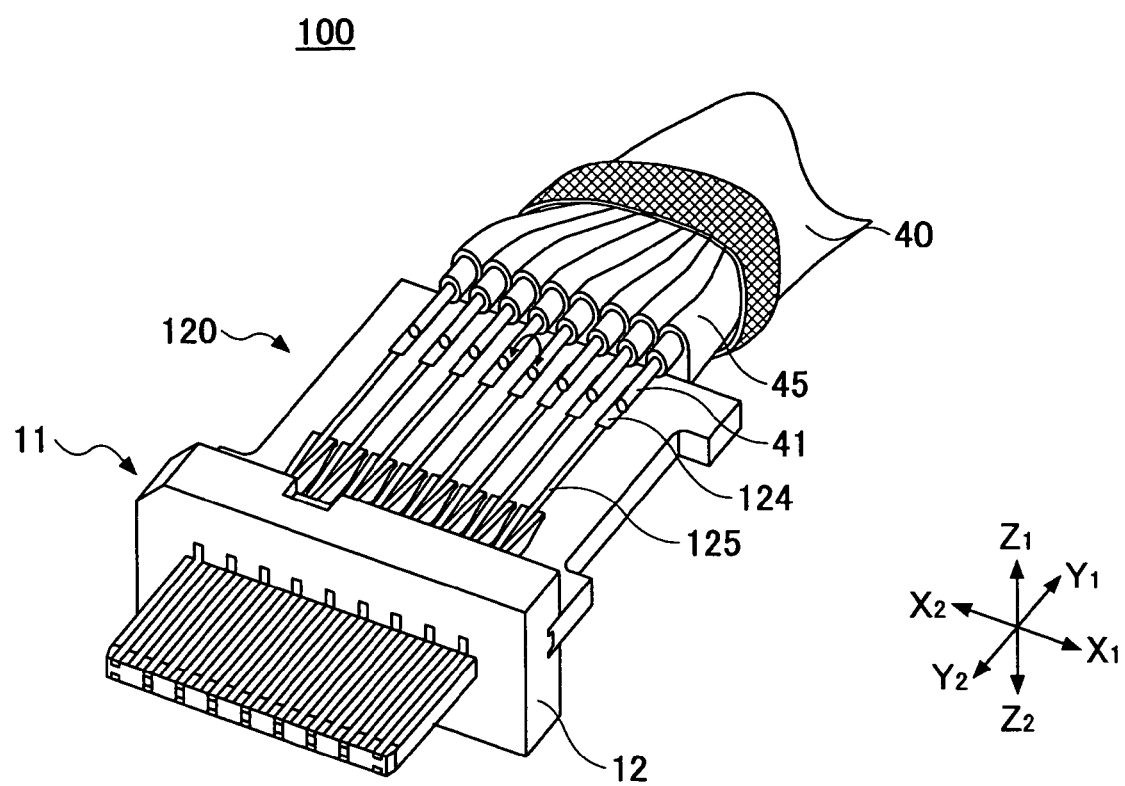
FIG. 6 is a perspective view of the cable connector for balanced transmission where a shield housing thereof is removed according to the first embodiment of the present invention.
Figure 6B:
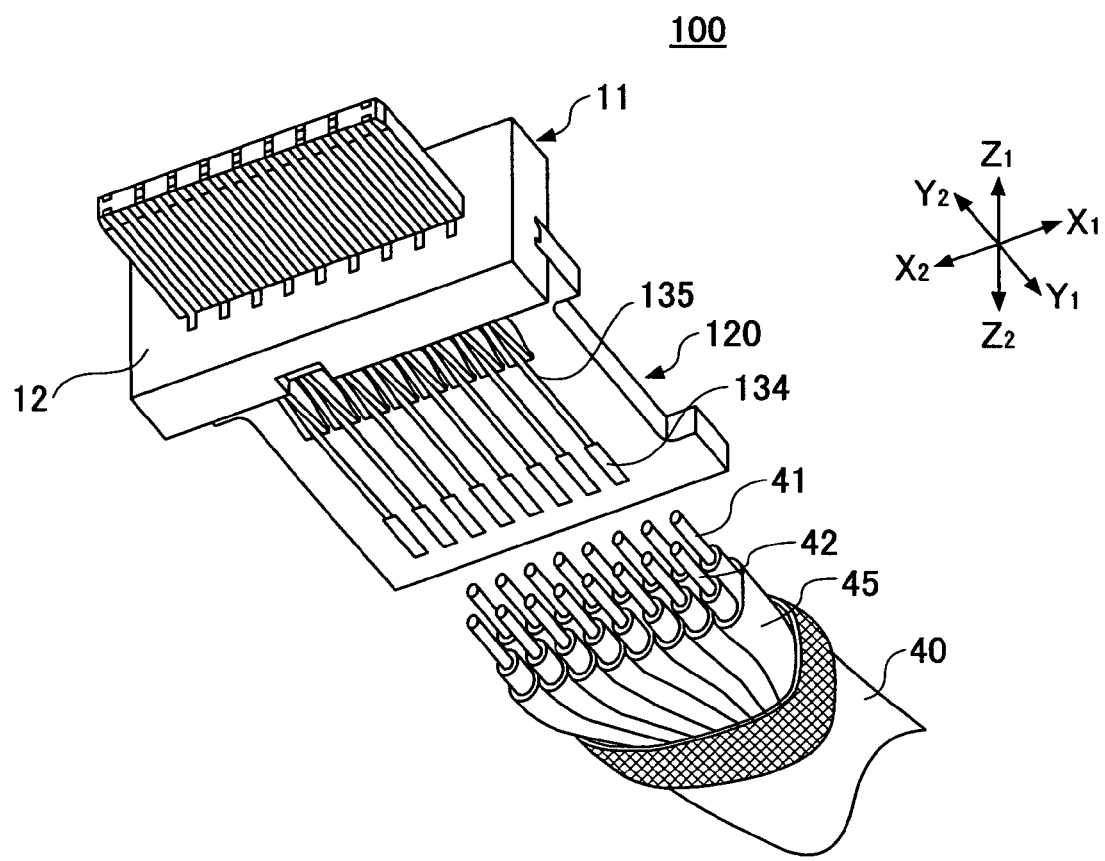
Figure 7:
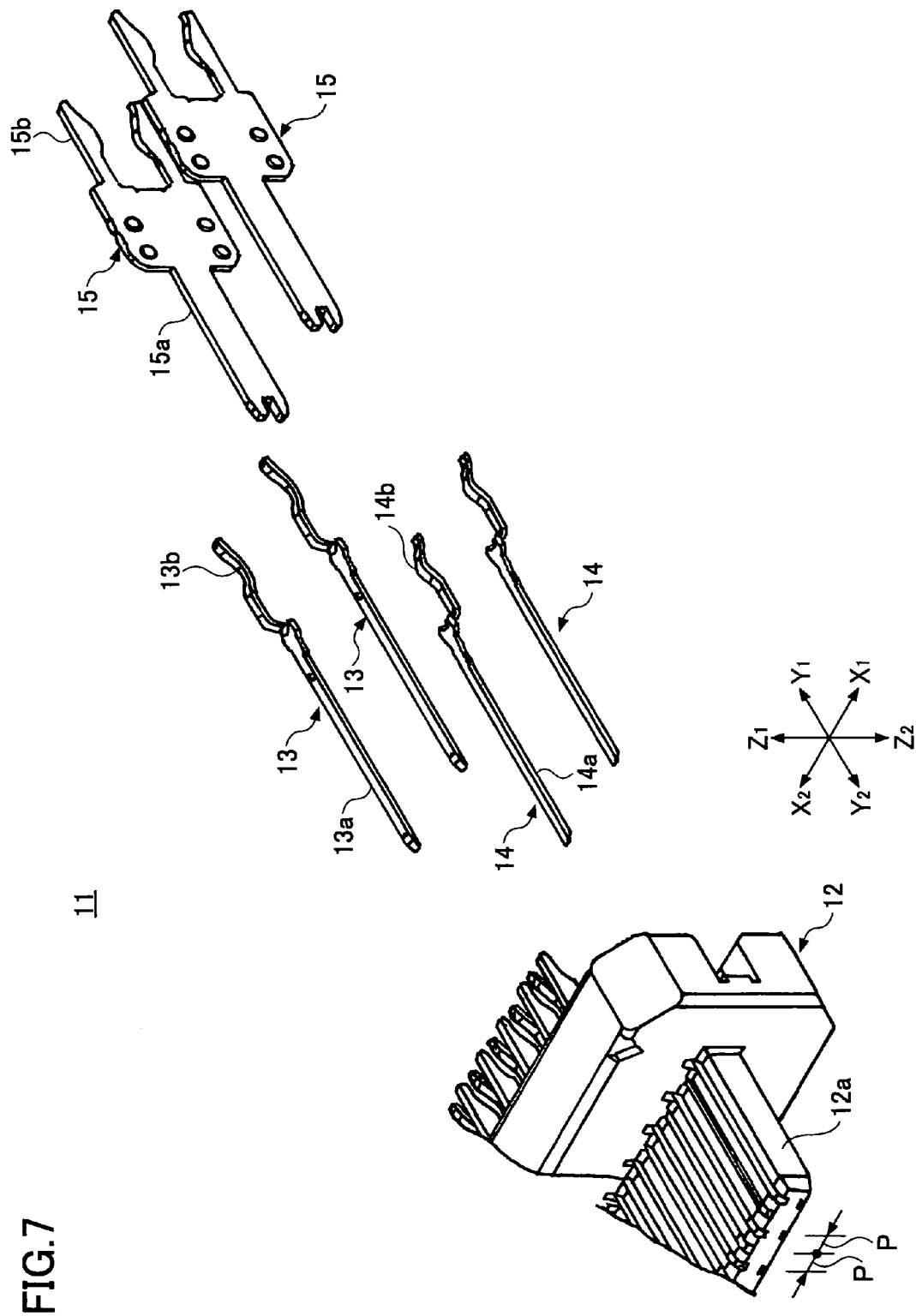
FIG. 7 is a view illustrating the contact assembly.
Figure 8A:
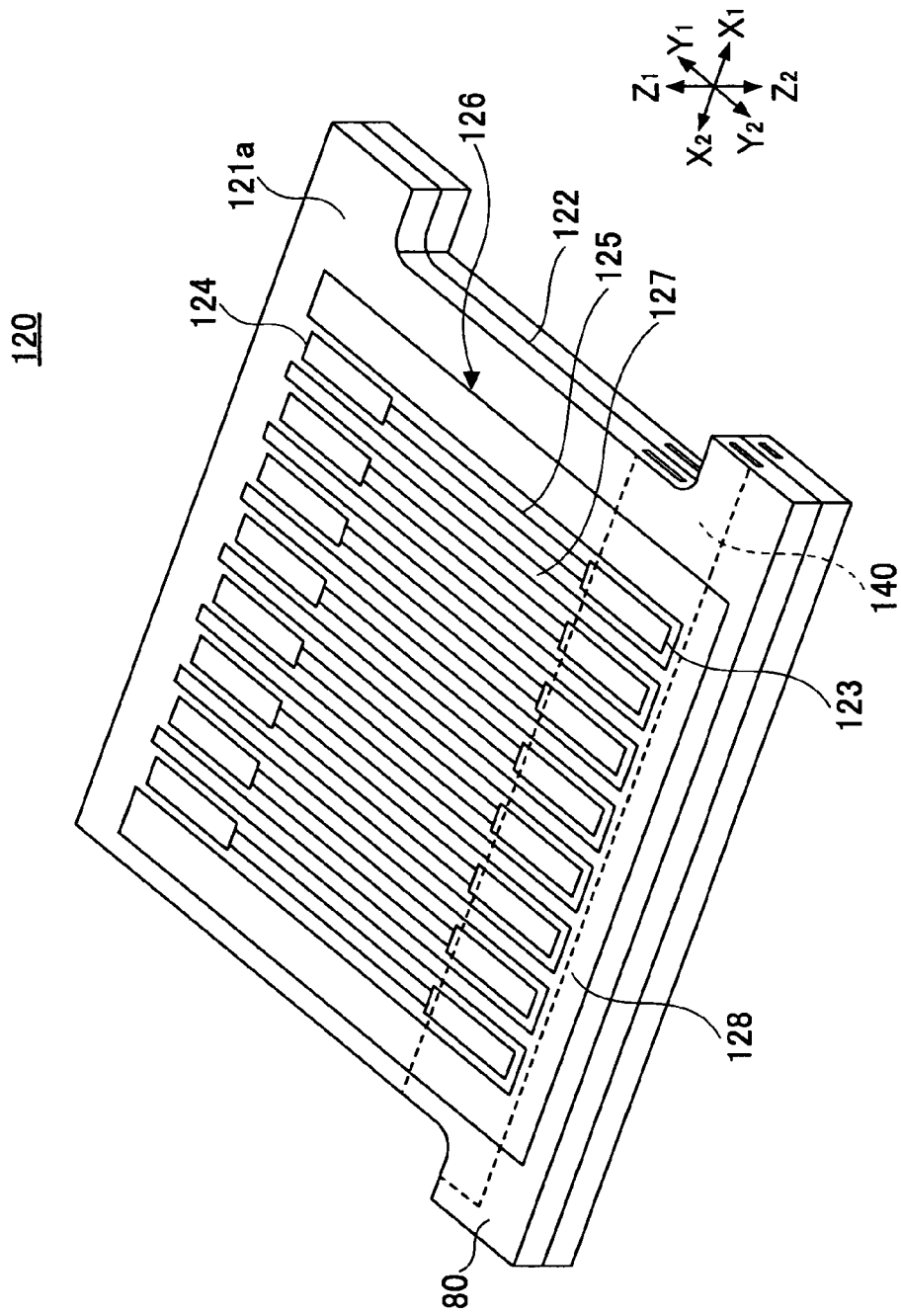
FIG. 8 is a perspective view illustrating the relay wiring substrate.
Figure 8B:
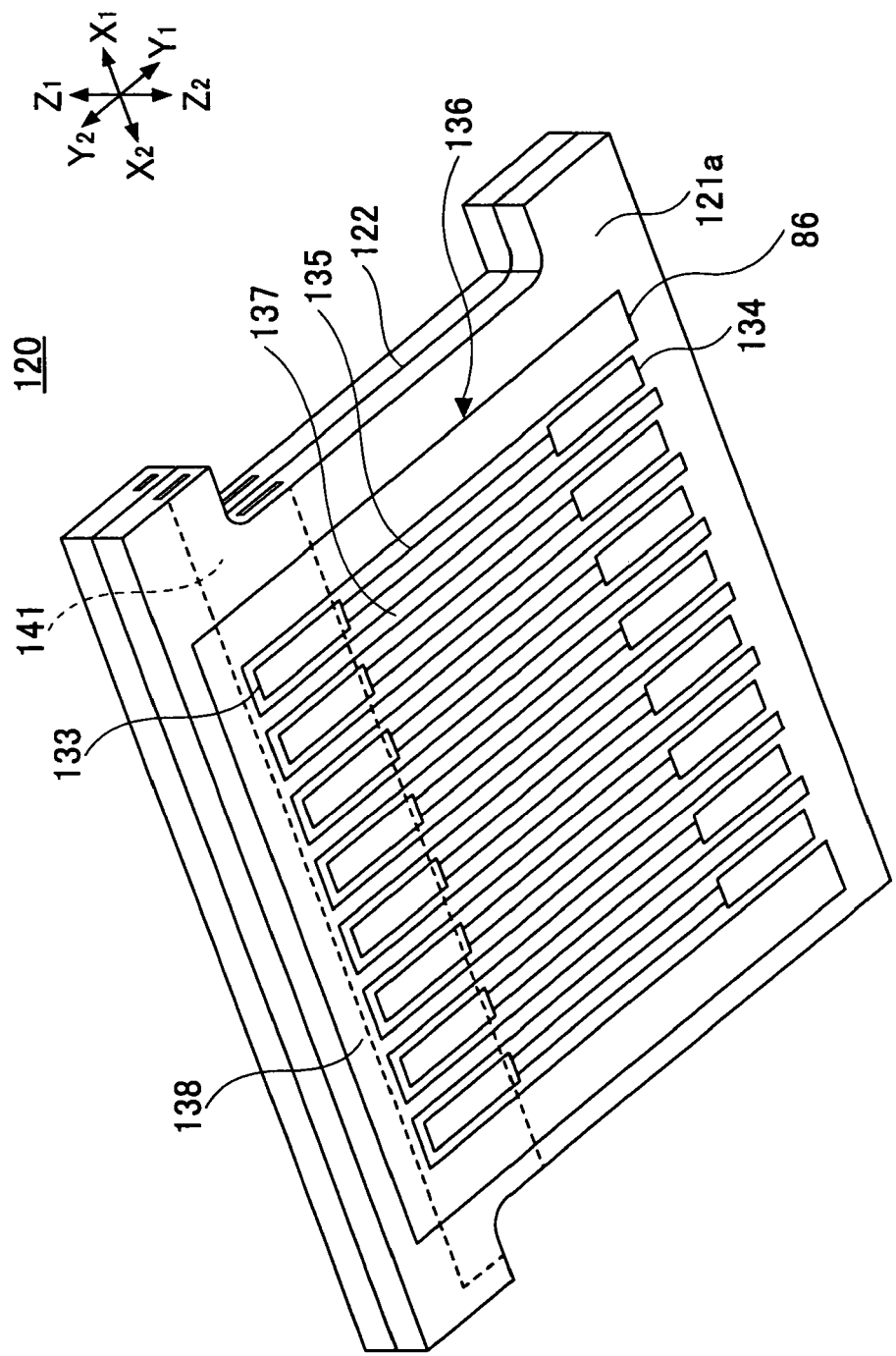
Figure 9:
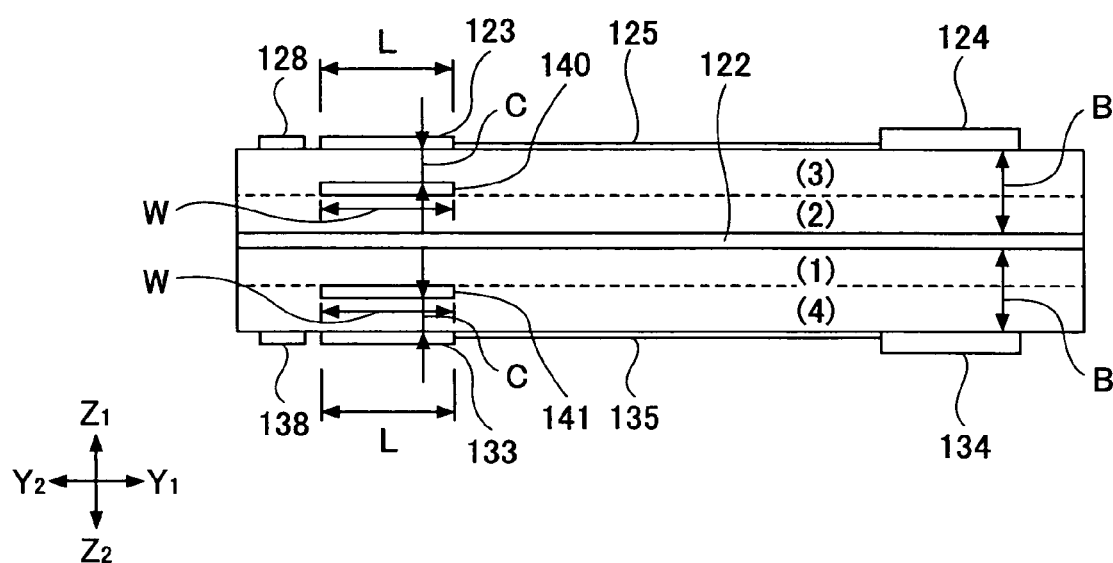
FIG. 9 is a schematic diagram illustrating the relay wiring substrate.
Figure 10:
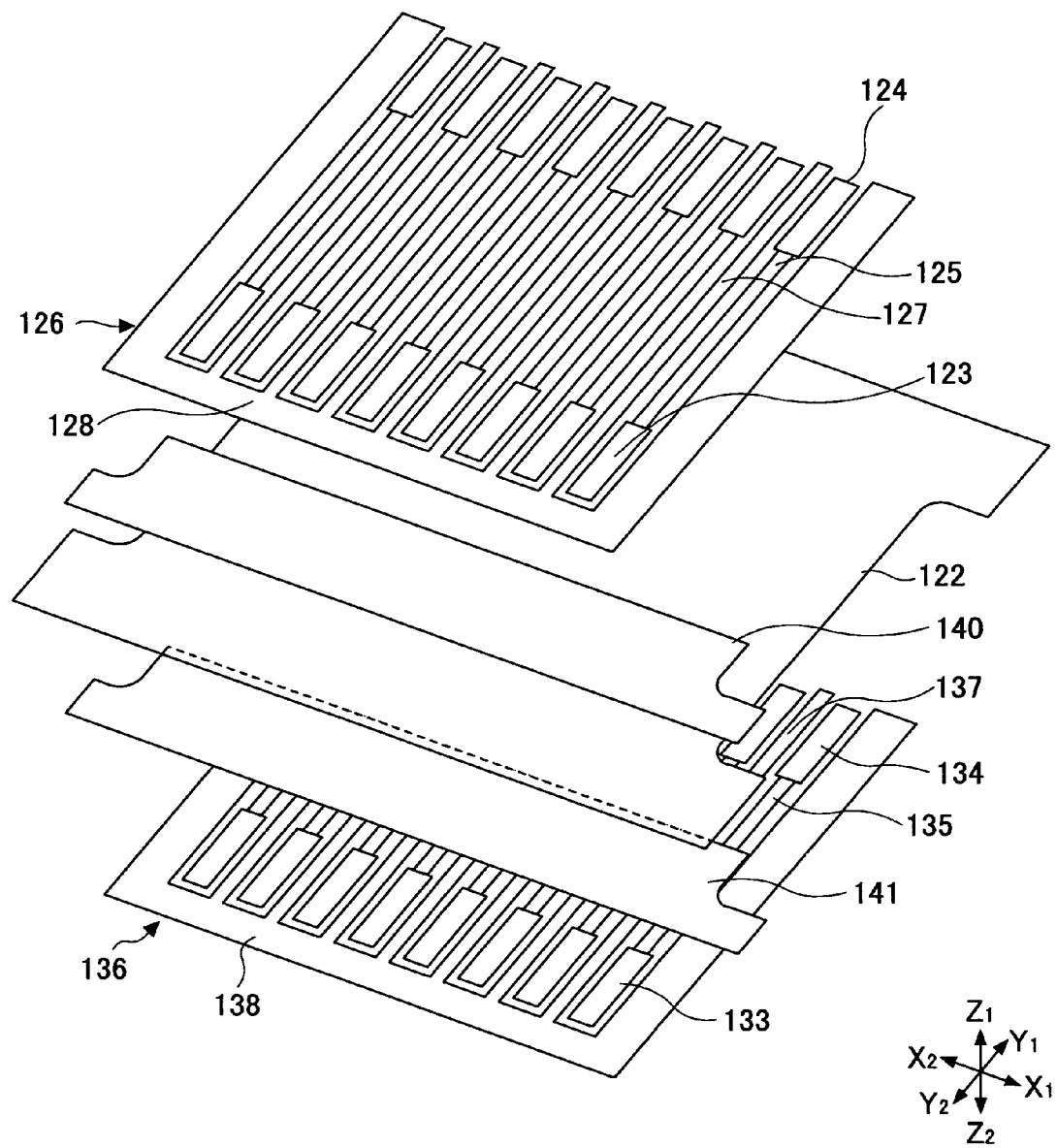
FIG. 10 is an exploded perspective view of the relay wiring substrate.
Figure 11A:
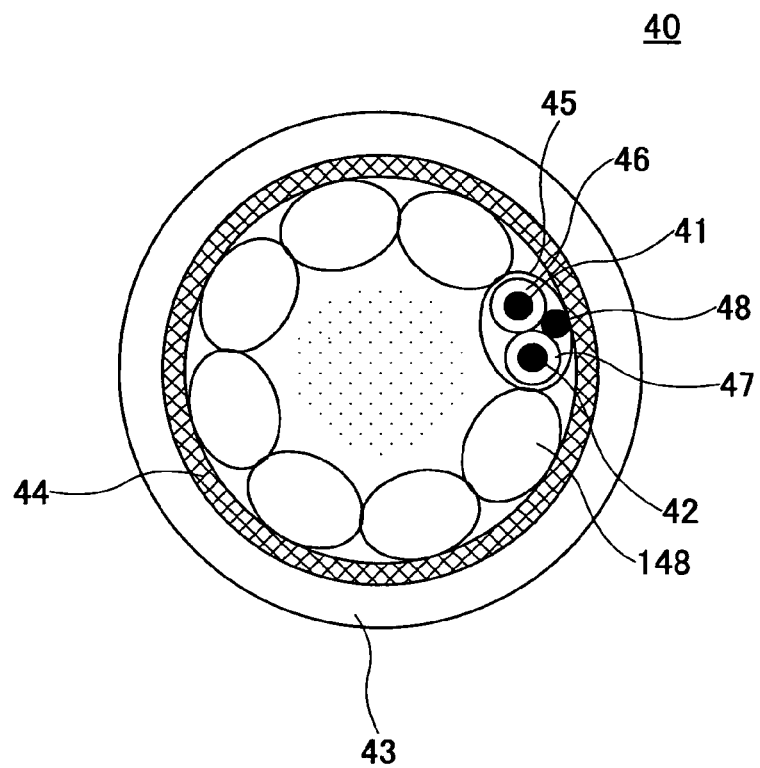
FIG. 11 is a view illustrating the cable for balanced transmission.
Figure 11B:
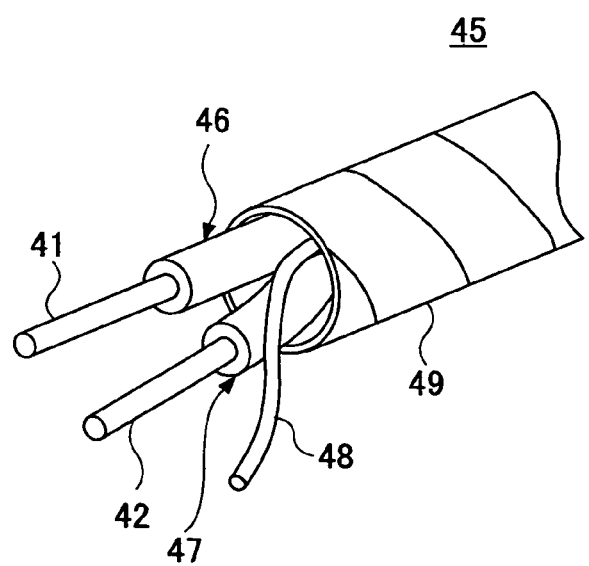

FIG. 4 is a view schematically showing a cable connector 100 for a balanced transmission according to a first embodiment of the present invention. FIG. 5 is a schematic diagram illustrating a relay wiring substrate 120 in FIG. 4 and a part where the relay wiring substrate 120, the cable 40 for the balanced transmission, and the contact assembly 11 are connected together. FIGS. 6A and 6B are views illustrating the cable connector 100 for the balanced transmission where a shield housing 50 is removed. FIG. 7 is a view illustrating a contact assembly. FIGS. 8A and 8B are perspective views illustrating the relay wiring substrate. FIG. 9 is a schematic diagram illustrating the relay wiring substrate. FIG. 10 is a view illustrating the relay wiring substrate where a pattern thereof is taken out. FIGS. 11A and 11B are views illustrating a cable for the balanced transmission. In the drawings, the lines X1-X2, Y1-Y2, and Z1-Z2 show a width direction, a length direction, and a height direction of the cable connector 60 for the balanced transmission, respectively. Y1 is a back, while Y2 is a front.

Figure 1:
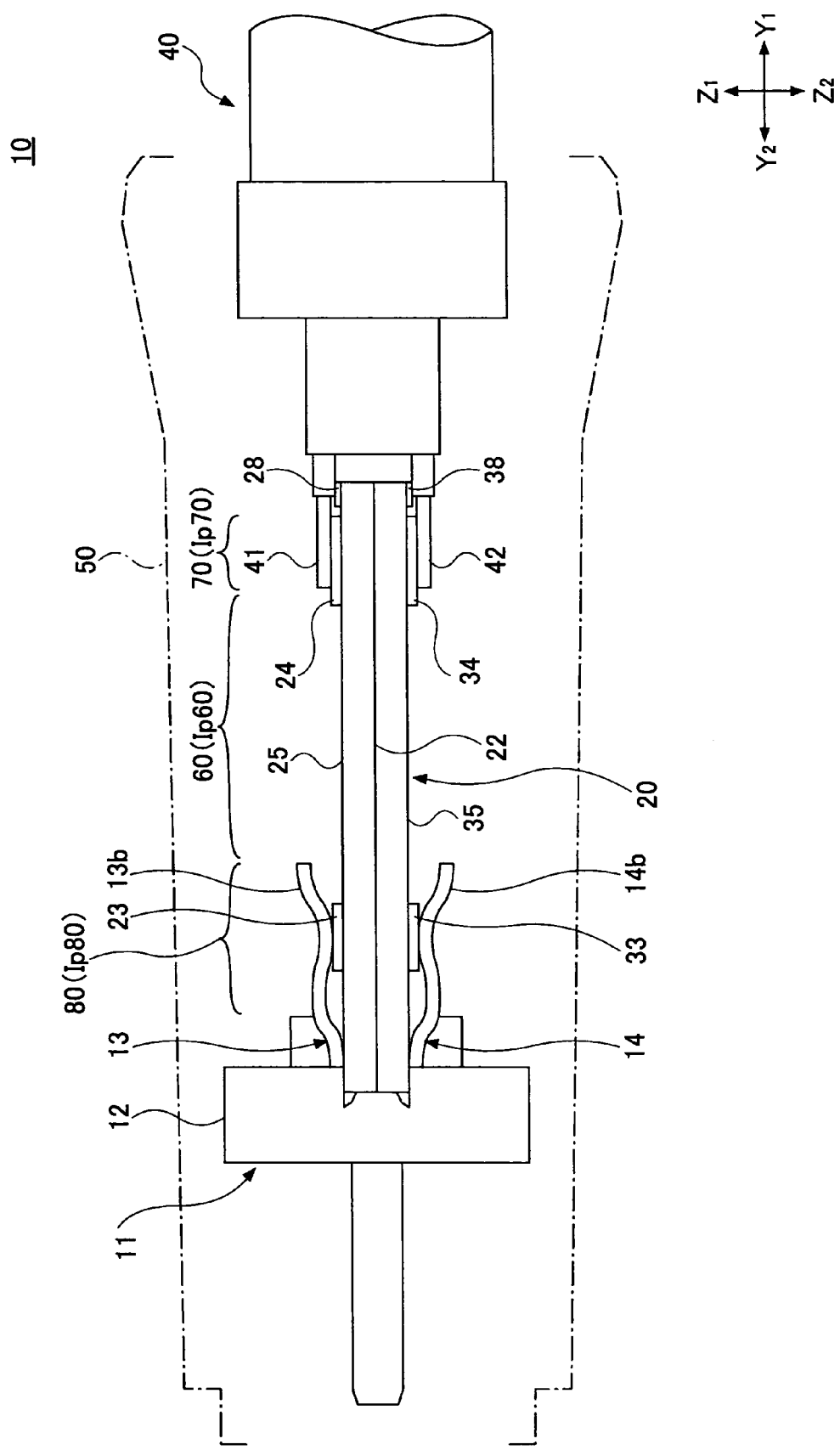
FIG. 1 is a view schematically illustrating a conventional cable connector for balanced transmission.
Figure 2:
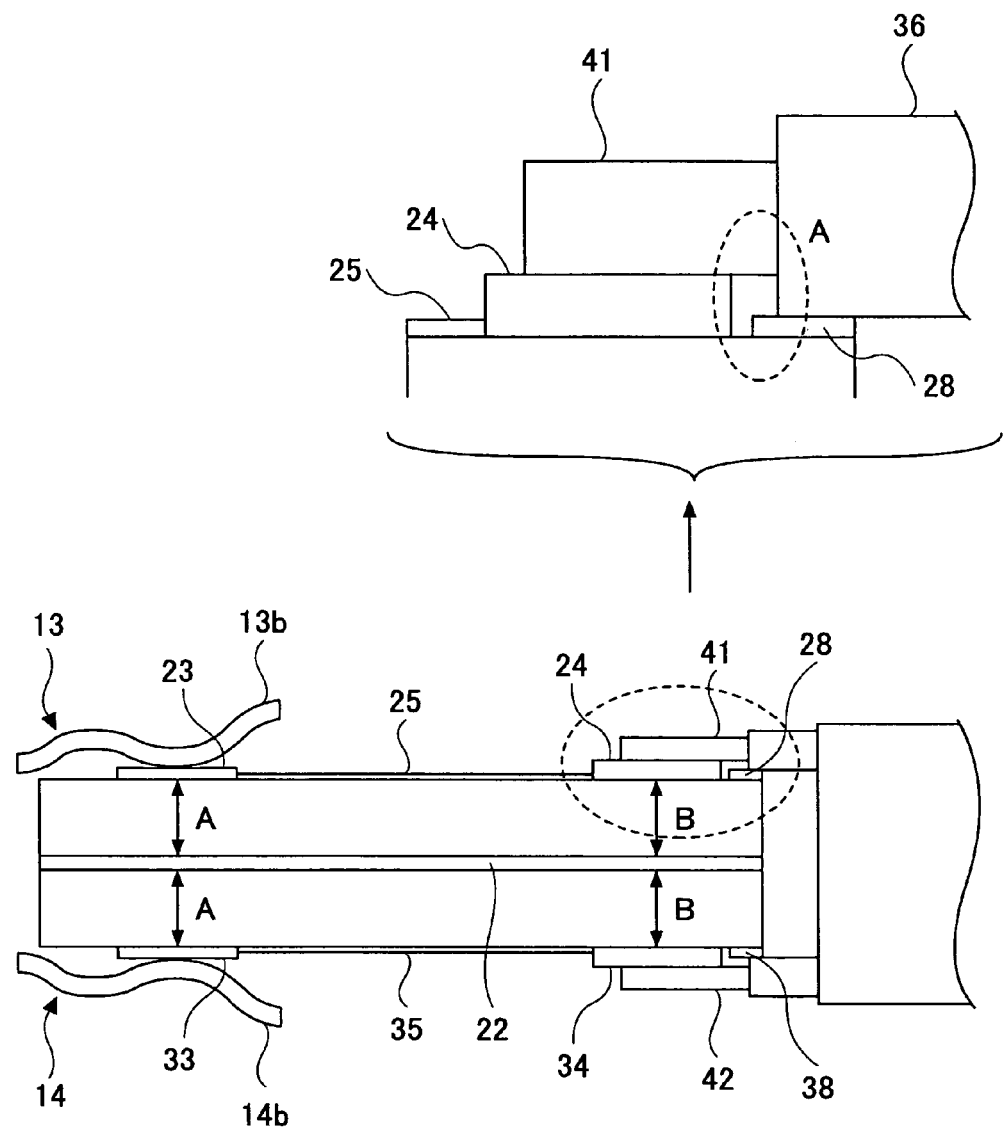
FIG. 2 is a view illustrating a relay wiring substrate and an enlarged part associated with the relay wiring substrate.

The cable connector 100 for the balanced transmission comprising a contact assembly 11, a relay wiring substrate 120, and a cable 40 for the balanced transmission, differs from the cable connector 10 for the balanced transmission as shown in FIG. 1 in including the relay wiring substrate 120. In FIGS. 4 through 11, the same components as shown in FIGS. 1 through 3 are given the same reference numerals.

(Contact Assembly 11)

FIG. 7 is a view illustrating the contact assembly 11 which is partly disassembled. As shown in FIG. 7, the contact assembly 11 comprises a block part 12 with electrical insulating properties, a pair of a first signal contact 13 and a second signal contact 14 arranged in the height direction (Z1-Z2), and a plate ground contact 15. The pair of the first and second signal contacts 13, 14 and the ground contact 15 are alternately arranged in the width direction (X1-X2) direction at a pitch P. The block part 12 includes a plug main body 12a protruding on the Y2 side. On the plug main body 12a, grooves are arranged. The first and second signal contacts 13 and 14 include first and second signal contacting portions 13a and 14a, and first and second finger portions 13b and 14b, respectively. The ground contact 15 includes a ground contacting portion 15a and a fork portion 15b. The first and second signal contacts 13, 14 and the ground contact 15 are incorporated so as to be inserted into the block part 12 from the Y1 side to the Y2 direction. The first signal contacting portion 13a is exposed on the upper surface of the plug main body 12a, and the second signal contacting portion 14a is exposed on the under surface of the plug main body 12a. Both upper and under edges of the ground contacting portion 15a are respectively exposed on the upper and under surface of the plug main body 12a. The first and second finger portions 13b, 14b and the fork portion 15b protrude from the block part 12 to the Y1 direction. These two signal contacts 13 and 14 comprise a contact pair.

(Relay Wiring Substrate 120)

FIGS. 8A and 8B are perspective views illustrating the relay wiring substrate 120 viewed from the Z1 side and the Z2 side, respectively. FIG. 9 is a schematic cross-sectional view illustrating the relay wiring substrate 120. FIG. 10 is a view illustrating the relay wiring substrate 120 where a pattern thereof is taken out.

The relay wiring substrate 120 having substantially a square shape contains therein ground patterns 140 and 141 for matching impedance so as to match an impedance value with a desired value, i.e., 100 Ω. Since the ground patterns 140 and 141 for matching impedance are provided, the relay wiring substrate 120 includes four insulating layers (1) through (4) as shown in FIG. 9.

Returning to FIGS. 8A and 8B, the relay wiring substrate 120 comprises a ground layer 122, and first and the second ground patterns 140 and 141 for matching impedance contained therein. The relay wiring substrate 120 further comprises, on a top surface 121a in the Z1 direction, a first contact connecting pad 123, a first wiring connecting pad 124, a first wiring pattern 125 connecting the first contact connecting pad 123 and the first wiring connecting pad 124, and a first ground pattern 126. The relay wiring substrate 120 further comprises, on a bottom surface 121b in the Z2 direction, a second contact connecting pad 133, a second wiring connecting pad 134, a second wiring pattern 135 connecting the second contact connecting pad 133 and the second wiring connecting pad 134, and a second ground pattern 136.

Figure 3A:
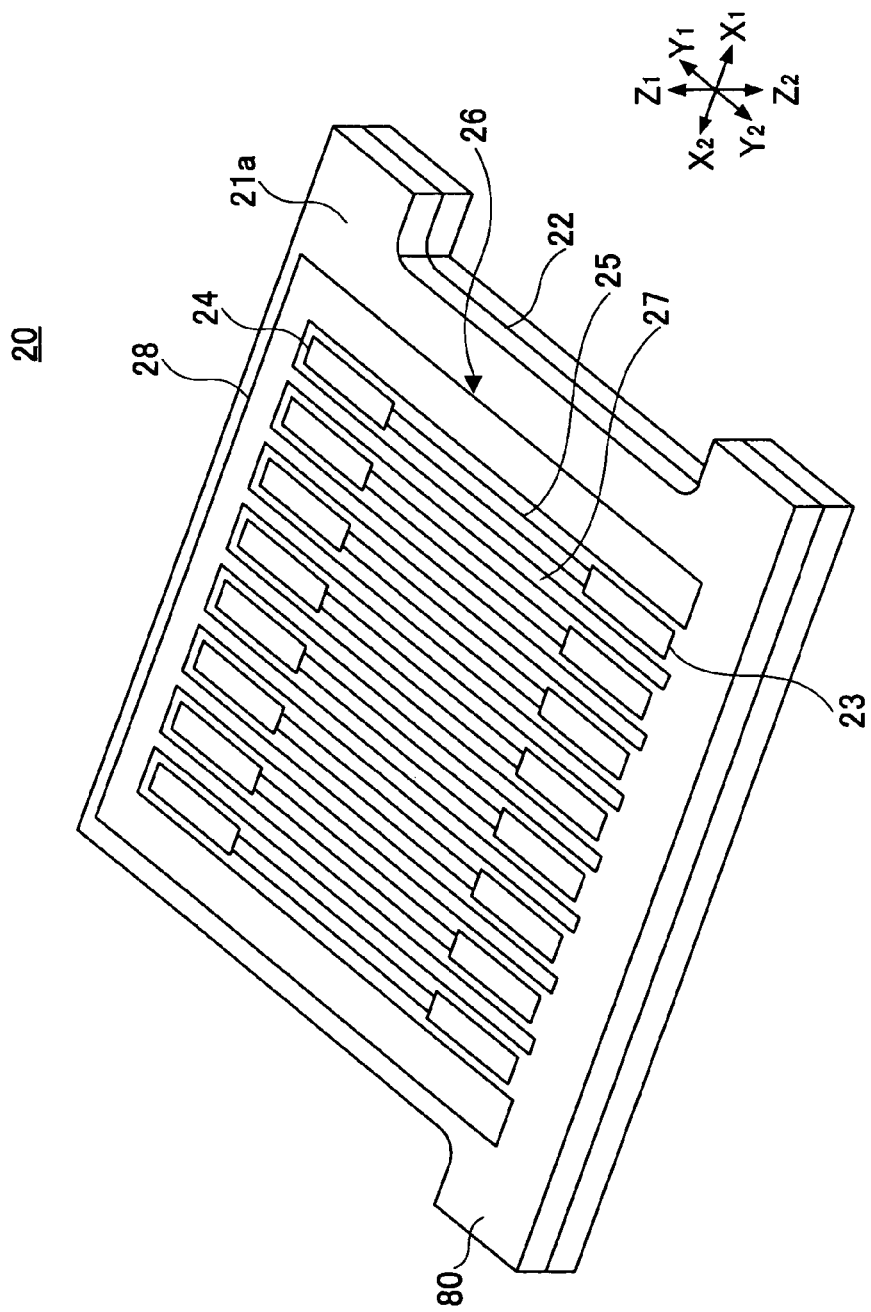
FIG. 3 is a perspective view illustrating the relay wiring substrate.
Figure 3B:
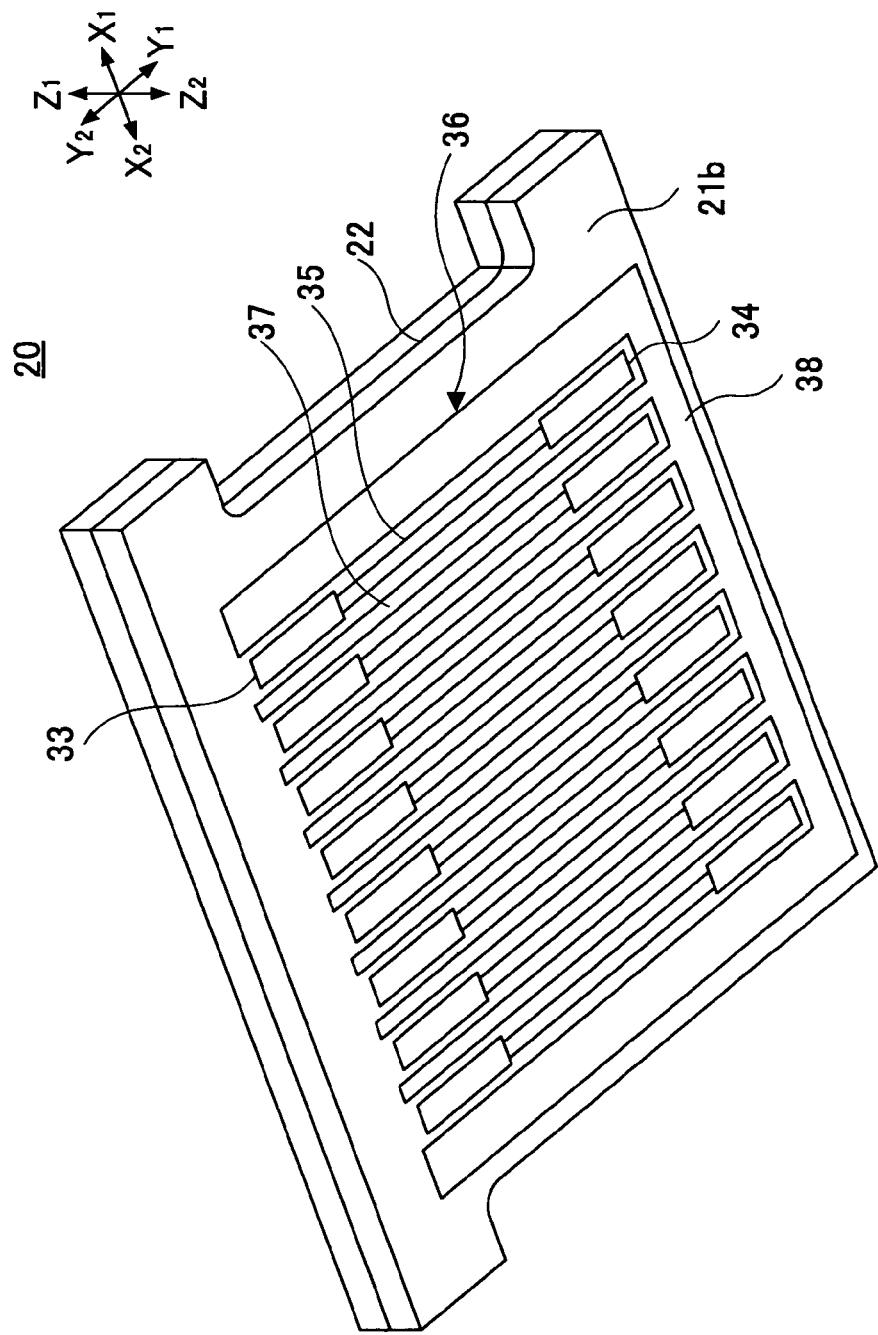

The first ground pattern 126 and the second ground pattern 136 both have a comb shape. The first ground pattern 126 comprises partitioning patterns 127 extending between the first wiring patterns 125, and a first Y2 side connecting pattern 128 on the Y2 side extending in the X1-X2 direction for connecting ends of the respective partitioning patterns 127 on the Y2 side. In the same manner, the second ground pattern 136 comprises partitioning patterns 137 extending between the first wiring patterns 135, and a first Y2 side connecting pattern 138 on the Y2 side extending in the X1-X2 direction for connecting ends of the respective partitioning patterns 137 on the Y2 side. In the status where the relay wiring substrate 120 is engaged and connected with the back of the contact assembly 11, the first and second Y2 side connecting patterns 128 and 138 are positioned where the first and the second finger portions 13b and 14b cover them, which first and the second finger portions 13b and 14b protrude in the Y1 direction from the block part 12 so as to reach the first and the second contact connecting pads 123 and 133, respectively. As described below, the first and second Y2 side connecting patterns 128 and 138 have a function of matching the impedance. The first and the second ground patterns 126 and 136 do not include patterns corresponding to the first and second Y1 side connecting patterns 28 and 38, respectively as shown in FIGS. 3A and 3B.

The ground layer 122 located at a center of the relay wiring substrate 120 in the thickness direction ranges over the entire relay wiring substrate 120.

The first and the second belt-shaped ground patterns 140 and 141 for matching impedance are long in the X1-X2 direction. The first ground pattern 140 for matching impedance is arranged between the ground layer 122 and the first contact connecting pads 123. The ground pattern 141 for matching impedance is arranged between the ground layer 122 and the second contact connecting pads 133. The first and the second ground patterns 140 and 141 for matching impedance having a width W equal to a length L of the first and the second contact connecting pads 123 and 133 are arranged at positions opposing the first and the second contact connecting pads 123 and 133, respectively.

In FIG. 5, impedance of the section 80 is determined by a distance C between the first contact connecting pad 123 and the first ground pattern 140 for matching impedance and between the second contact connecting pad 133 and the second ground pattern 141 for matching impedance. The distance C is substantially half of the above described distance B. Even in the case where the first and the second signal contacting portions 13a and 14a are not soldered, the impedance of the section 80 is lower than the impedance of the section 80 of the conventional relay wiring substrate 20.

It should be noted that the distance B is a thickness between the layers necessary to match the impedance of the first and the second wiring connecting pads 124 and 134, which thickness is equal to, for example, 0.5 mm. The distance C is a thickness between the layers necessary to match the impedance of the first and second contact connecting pads 123 and 133, which thickness is equal to, for example, 0.25 mm.

Further, the above described first and the second Y2 connecting patterns 128 and 138 are arranged at positions where they are respectively straddled by the first finger portion 13b of the first signal contact 13 and the second finger portion 14b of the second signal contact 14 which are described below. The first and the second Y2 connecting patterns 128 and 138 operate as a ground pattern for matching impedance.

(Cable 40 for Balanced Transmission)

FIGS. 11A and 11B are views illustrating the cable 40 for balanced transmission. The cable 40 for balanced transmission is, as shown in FIG. 11A, configured such that eight pair cables 45 are assembled in a duplex covering comprising an external covering 43 and a braid shield 44. Each of the pair cables 45 is configured such that a pair of insulated and coated signal cables 46 and 47 for transmitting balanced signals and a drain wiring 48 are bound together by a coiled metal tape 49 so as to be shielded. From an end of the pair cable 45, the pair of the insulated and coated signal cables 46 and 47 for balanced transmission and the drain wiring 48 extend outside. The ends of the insulated and coated signal cables 46 and 47 are processed so as to expose the signal wirings 41 and 42.

(Cable Connector 100 for Balanced Transmission)

Returning to FIGS. 4, 6A and 6B, the cable connector 100 for balanced transmission is configured such that the end on the Y2 side of the relay wiring substrate 120 fits into the back of the contact assembly 11. An end of the cable 40 for balanced transmission is connected to an end of the relay wiring substrate 120. The respective ends of the contact assembly 11, the relay wiring substrate 120, and the cable 40 are covered by a shield housing 50.

The Y2 side of the relay wiring substrate 120 engages the Y1 side of the contact assembly 11. The first contact connecting pad 123 is soldered to the first finger portion 13b of the first signal contact 13. The second contact connecting pad 133 is soldered to the second finger portion 14b of the second signal contact 14. The first and second ground patterns 125 and 135 are soldered to the corresponding fork portions 15b of the ground contacts 15 so as to be fixed.

As for the cable 40 for balanced transmission, the signal wirings 41 and 42 of the end of each of the pair wirings 45 are soldered to the first and the second wiring connecting pads 123 and 133, respectively. It should be noted that the drain wirings 48 extending from the respective pair wirings 45 are bound together and soldered with one pad so as to assemble the cable connector 100 for balanced transmission easily.

The cable connector 100 for balanced transmission includes sections 60A, 70A, and 80A at the relay wiring substrate 120 in the same manner as described above. The section 70A corresponds to the section 70 in FIG. 1. The section 70A is where the wirings 41 and 42 are soldered to the first and the second wiring connecting pads 124 and 134, respectively. The section 80A corresponds to the section 80 in FIG. 1. The section 80A is where the first and the second signal contacts 13 and 14 are soldered to first and the second contact connecting pads 123 and 133, respectively. The section 60A corresponds to the section 60 in FIG. 1. The section 60A is provided between the sections 70A and 80A.

(About Section 60A)

An impedance Ip60A of the section 60A is equal to 100 Ω.

(About Section 70A)

The first and the second ground patterns 126 and 136 do not include patterns corresponding to the first and the second Y1 side connecting patterns 28 and 38 as shown in FIGS. 3A and 3B. Accordingly, in the enlarged view of FIG. 5, as shown by a circle B, the wiring 41 (42) does not oppose the ground pattern on the surface of the relay wiring substrate 120. Hence, the wiring 41 (42) is not subjected to the influence of the ground pattern on the surface of the relay wiring substrate 120. Therefore, an impedance Ip70A of the section 70A is a value which is more approximate to 100 Ω than the impedance Ip70 of the conventional section 70.

(About Section 80A)

First, the first and the second ground patterns 140 and 141 for matching impedance are provided. Second, the first Y2 side connecting pattern 128 is positioned immediately under (Z2 side) the first finger portion 13b of the first signal contact 13. Further, the second Y2 side connecting pattern 138 is positioned immediately under the first finger portion 13b of the first signal contact 13. Accordingly, the impedance Ip80A of the section 80A is lower than the impedance Ip80 of the conventional section 80. Thus, the impedance Ip80A is more approximate to 100 Ω than the impedance Ip80 of the conventional section 80.

Accordingly, as for the cable connector 100 for balanced transmission, both the difference of the impedance between the sections 70A and 60A, and the difference of the impedance between the sections 60A and 80A are small in comparison to the differences of the impedance between the conventional sections. Therefore, the cable connector 100 for balanced transmission includes a satisfactory signal transmission property in comparison to the conventional cable connector 10 for balanced transmission.

Next, modified examples are described of the relay wiring substrate 120 used in the above described cable connector 100 for balanced transmission.

FIRST MODIFIED EXAMPLE

Figure 12:
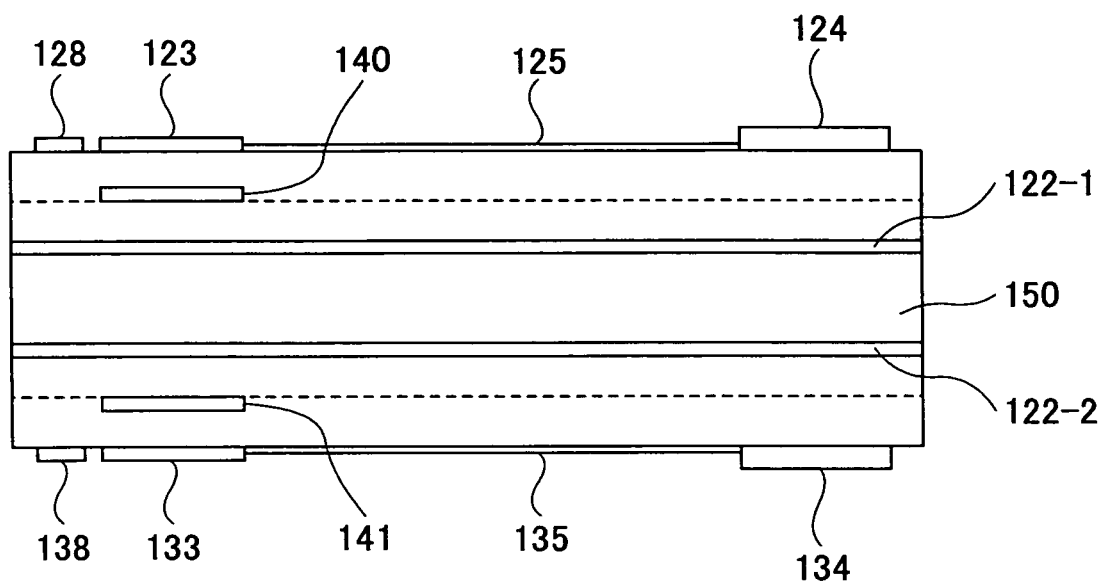
FIG. 12 is a schematic diagram illustrating a relay wiring substrate of a first modified example.

FIG. 12 is a view of a first modified example of a relay wiring substrate 120A. The relay wiring substrate 120A comprises two ground layers 122-1 and 122-2. The ground layers 122-1 and 122-2 are formed on the upper and under surfaces of a base member 150, respectively.

SECOND MODIFIED EXAMPLE

Figure 13:
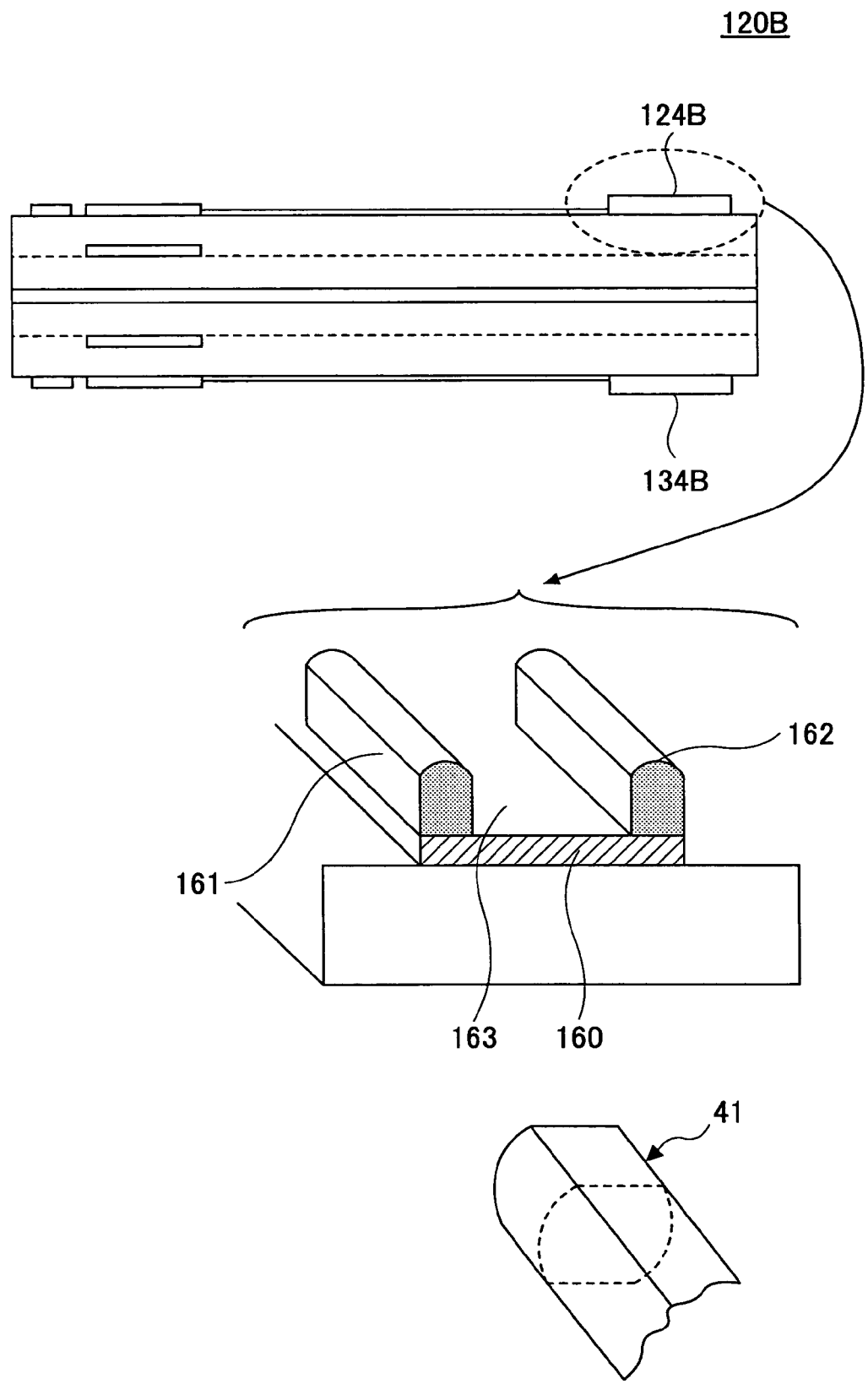
FIG. 13 is an exploded schematic diagram illustrating a relay wiring substrate of a second modified example.

FIG. 13 is a view of a second modified example of a relay wiring substrate 120B. The relay wiring substrate 120B differs from the relay wiring substrate 120 shown in FIG. 9 in including a first wiring connecting pad 124B and a second wiring connecting pad 134B.

The first wiring connecting pad 124B comprises, as shown by an enlarged view of FIG. 13, preliminary soldering portions 161 and 162 at opposite ends in the width direction of a ground pattern 160 so that a groove portion 163 is formed by the preliminary soldering portions 161 and 162. The wiring 41 is appropriately arranged by engaging the groove portion 163 and being soldered onto a center of the ground pattern 160. The wiring 41 may be crushed so that a cross-section thereof is ovalized as shown in FIG. 13.

Figure 14A:
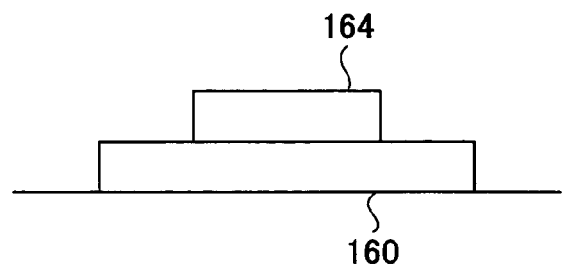
FIGS. 14A through 14D are views for explaining a method of forming a wiring connecting pad with a groove part.
Figure 14B:
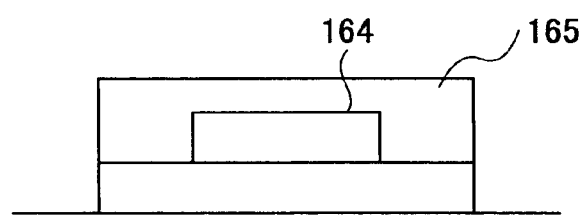
Figure 14C:
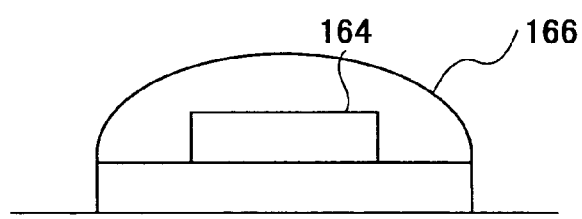
Figure 14D:
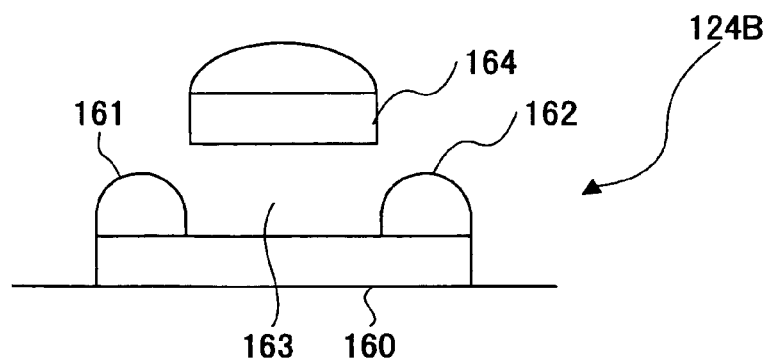

As shown in FIG. 14A, a heat-resistant tape 164 is attached onto the center of the ground pattern 160. Cream solder 165 is applied to the ground pattern 160 as shown in FIG. 14B, and then heated so that the cream solder 165 melts. Accordingly, as shown in FIG. 14C, the melted cream solder 165 is coagulated to become solder 166. Finally, as shown in FIG. 14D, the tape 164 is peeled off so that the preliminary soldering portions 161 and 162 having shapes as ribs are left on the ground pattern 160. Accordingly, the wiring connecting pad 124B is formed.

The second wiring connecting pad 134B has the same configuration as the first wiring connecting pad 124B.

Figure 15A:
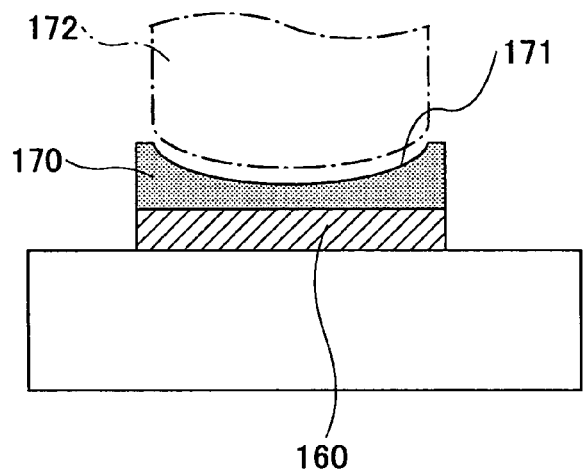
FIGS. 15A and 15B are views illustrating wiring connecting pads according to the first and second modified examples, respectively.

FIG. 15A is a view illustrating a first wiring connecting pad 124B-1 of the first modified example. The wiring connecting pad 124B-1 comprises a preliminary soldering portion 170. The preliminary soldering portion 170 includes a groove portion 171 which is formed by pressing a shape forming member 172 onto an upper surface of the preliminary soldering portion 170.

Figure 15B:
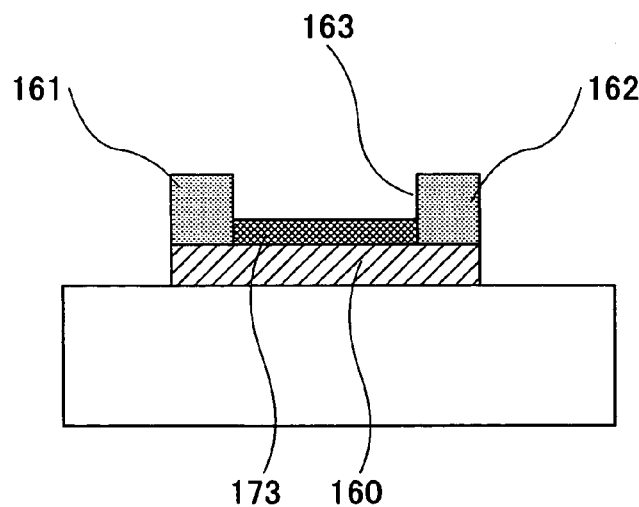

FIG. 15B is a view illustrating a first wiring connecting pad 124B-2 of the second modified example. The first wiring connecting pad 124B-2 differs from the first wiring connecting pad 124B shown in FIG. 13 in further including a resist film 173 on a bottom of the groove portion 163. The resist film 173 is provided at a center of the ground pattern 160 before the cream solder is applied so as to repel the cream solder. The resist film 173 remains on the ground pattern 160 to the last.

Figure 16A:
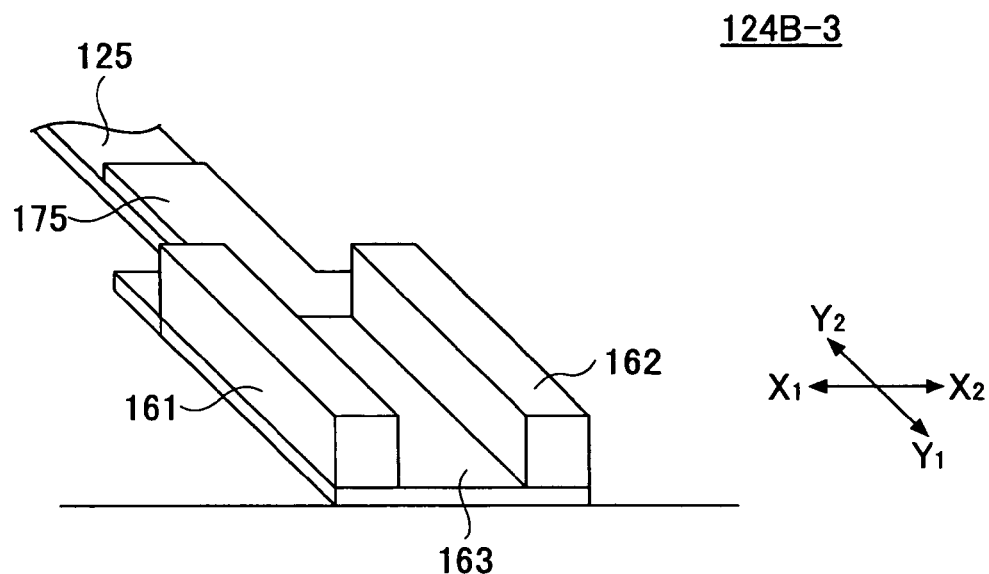
FIGS. 16A and 16B are views illustrating a wiring connecting pad according to a third modified example.
Figure 16B:
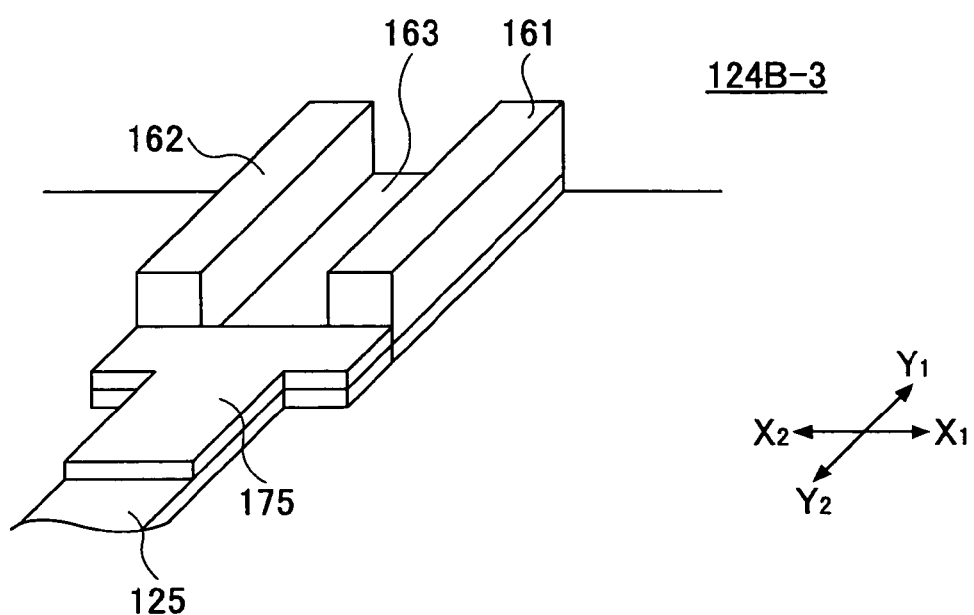

FIGS. 16A and 16B are views illustrating a first wiring connecting pad 124B-3 of a third modified example. The first wiring connecting pad 124B-3 differs from the first wiring connecting pad 124B shown in the enlarged view of FIG. 13 in further including, on the Y2 side, a T-shaped insulating pattern 175 extending in the Y2 direction on the first wiring pattern 125. The insulating pattern 175 prevents the solder from flowing out in the Y2 direction when connecting wirings.

Figure 17A:
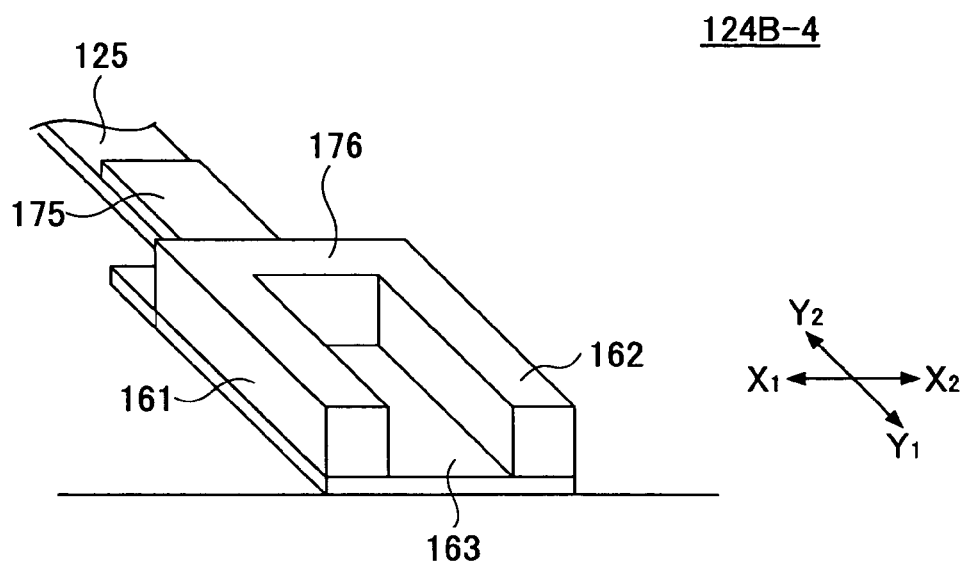
FIGS. 17A and 17B are views illustrating a wiring connecting pad according to a fourth modified example.
Figure 17B:
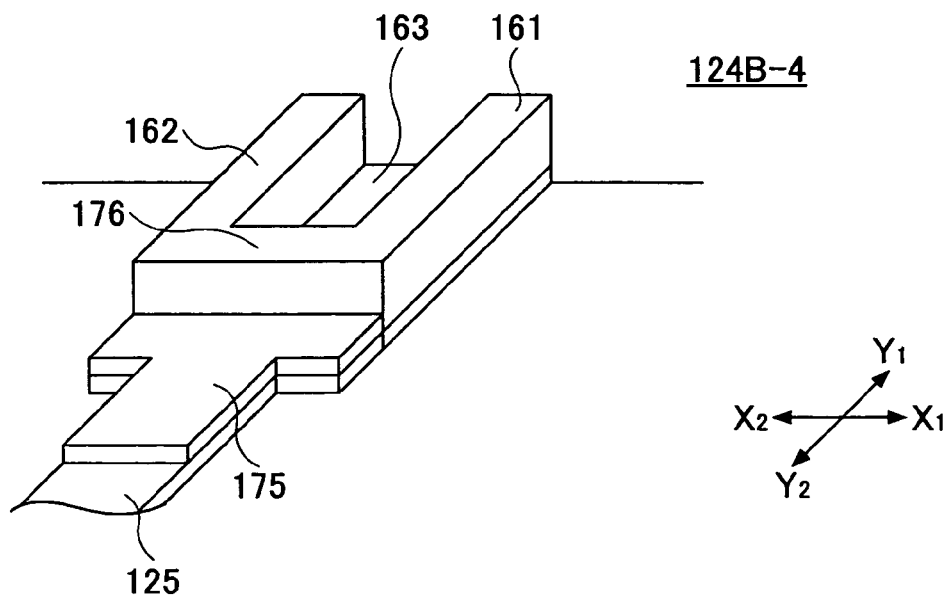

FIGS. 17A and 17B are views illustrating a first wiring connecting pad 124B-4 of a fourth modified example. The first wiring connecting pad 124B-4 differs from the first wiring connecting pad 124B-3 shown in FIGS. 16A and 16B in further including a preliminary soldering portion 176 across the groove portion 163 on the Y2 side. When connecting the wiring, the wring is prevented from moving out of the groove portion 163 in the Y2 direction in addition to the X1 and X2 directions.

THIRD MODIFIED EXAMPLE

Figure 18:
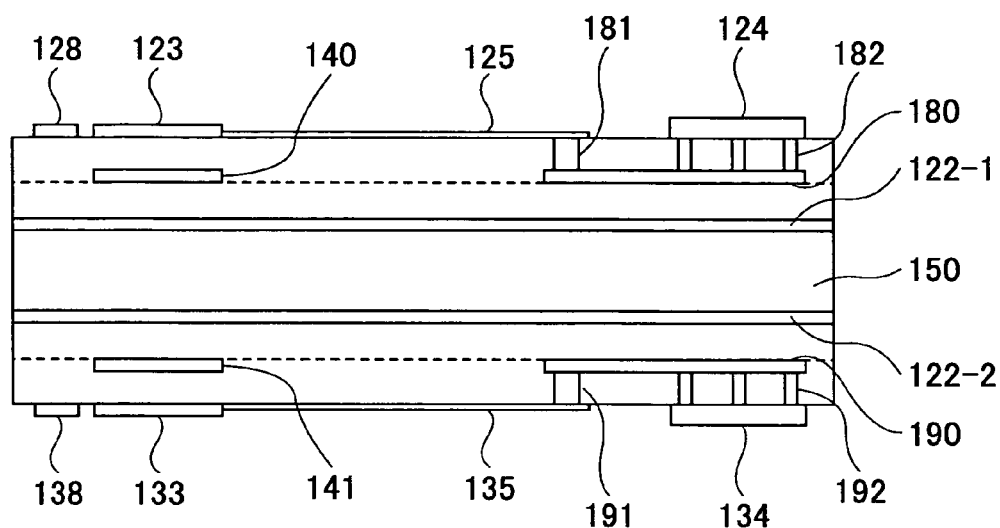
FIG. 18 is a schematic diagram illustrating a relay wiring substrate of the third modified example.

FIG. 18 is a view illustrating a relay wiring substrate 120C of a third modified example. The relay wiring substrate 120C differs from the relay wiring substrate 120A shown in FIG. 12 in further including first and second linear inner layer patterns 180 and 190 between parts corresponding to the first wiring connecting pad 124 and the second wiring connecting pad 134. Further, ends of the first and second inner layer patterns 180 and 190 are connected to the first and second wiring patterns 125 and 135, respectively by vias 181 and 191. Moreover, the first wiring connecting pad 124 is connected to the first inner layer pattern 180 by plural vias 182. Furthermore, the second wiring connecting pad 134 is connected to the second inner layer pattern 190 by plural vias 192.

According to the plural vias 182 and 192, fixing power is reinforced for the first wiring connecting pad 124 and the second wiring connecting pad 134 onto the upper and bottom surfaces of the relay wiring substrate, respectively.

Accordingly, even if a cable is vainly moved so that superfluous force acts on the first wiring connecting pad 124 and the second wiring connecting pad 134 via the wiring, the first wiring connecting pad 124 and the second wiring connecting pad 134 are prevented from being peeled off the relay wiring substrate.

FOURTH MODIFIED EXAMPLE

Figure 19:
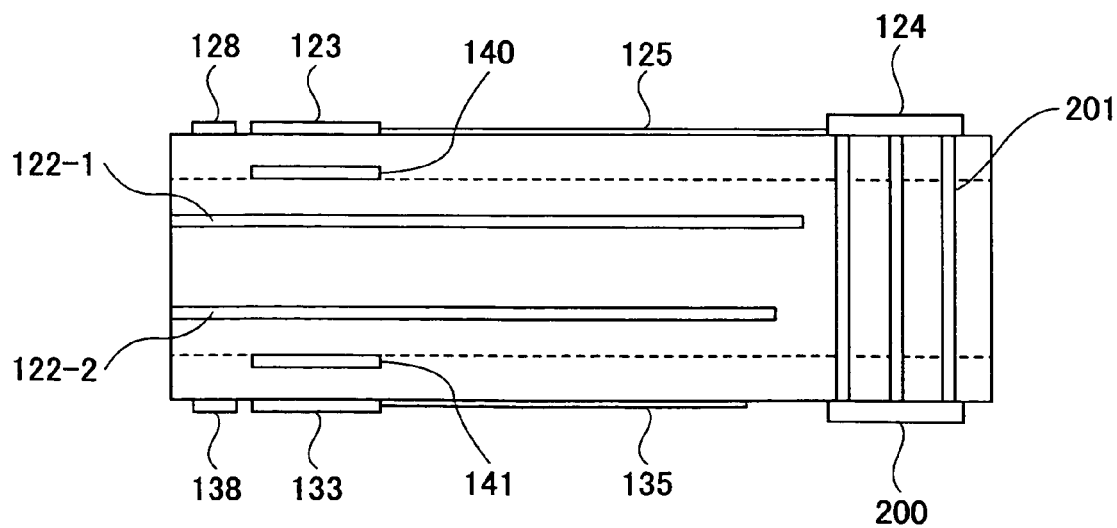
FIG. 19 is a schematic diagram illustrating a relay wiring substrate of the fourth modified example.

FIG. 19 is a view illustrating a relay wiring substrate 120D of a fourth modified example. The relay wiring substrate 120D differs from the relay wiring substrate 120A shown in FIG. 12 in further including a pattern 200 on the bottom surface instead of the second wiring connecting pad 134. In addition, the first wiring connecting pad 124 is connected to the pattern 200 by plural vias 201.

According to the plural vias 201, fixing power is reinforced for the first wiring connecting pad 124 onto the upper surface of the relay wiring substrate.

This application claims the benefit of a Japanese Patent Application No. 2005-330472 filed on Nov. 15, 2005, in the Japanese Patent Office, the disclosure of which is hereby incorporated by reference.

Further, the present invention is not limited to these embodiments, but various variations and modifications may be made without departing from the scope of the present invention.

What is claimed is:

1. A cable connector, comprising:
a contact assembly including an electrical insulating block part which is configured to incorporate a plurality of signal contacts therein;
a relay wiring substrate mounted to a back of said contact assembly, said relay wiring substrate including, on a surface thereof, a contact connecting pad electrically connected to one of said signal contacts, a wiring connecting pad, and a wiring pattern connecting the contact connecting pad and the wiring connecting pad, said relay wiring substrate further including a ground layer inside said relay wiring substrate; and
a cable connected to said relay wiring substrate by electrically connecting an end of a wiring with the wiring connecting pad, wherein
said relay wiring substrate further includes a pair of ground patterns matching impedance, inside said relay wiring substrate, each ground pattern being located on a layer above and below the ground layer, respectively.

2. The cable connector as claimed in claim 1, wherein said relay wiring substrate is configured such that one of the ground patterns for matching impedance is provided between the contact connecting pad and the ground layer.

3. A cable connector, comprising:
a contact assembly including an electrical insulating block part which is configured to incorporate a plurality of signal contacts and a plurality of ground contacts therein;
a relay wiring substrate mounted to a back of said contact assembly, said relay wiring substrate including a ground layer inside said relay wiring substrate, said relay wiring substrate further including:
a first contact connecting pad electrically connected to one of said signal contacts;
a first wiring connecting pad;
a first wiring pattern connecting said first contact connecting pad and said first wiring connecting pad;
a first ground pattern having a comb shape electrically connected to said ground contact, said first contact connecting pad, said first wiring connecting pad, said first wiring pattern, and said first ground pattern being provided on an upper surface of said relay wiring substrate;
a second contact connecting pad electrically connected to said signal contact;
a second wiring connecting pad;
a second wiring pattern connecting said second contact connecting pad and said second wiring connecting pad; and
a second ground pattern having a comb shape electrically connected to said ground contact, said second contact connecting pad, said second wiring connecting pad, said second wiring pattern, and said second ground pattern being provided on an under surface of said relay wiring substrate; and
a cable being connected to said relay wiring substrate, said cable comprising a plurality of shielded pair cables respectively exposing two wirings, one wiring of each of said plurality of shielded pair cables being electrically connected to the first wiring connecting pad of the relay wiring substrate, and another wiring being electrically connected to the second wiring connecting pad of the relay wiring substrate, wherein
said relay wiring substrate further includes at least one additional ground pattern for matching impedance inside said relay wiring substrate.

4. The cable connector as claimed in claim 3, wherein said at least one additional ground pattern for matching impedance includes a first additional ground pattern provided between the first contact connecting pad and the ground layer, and a second additional ground pattern provide between the second contact connecting pad and the ground layer, respectively.

5. A cable connector, comprising:
a contact assembly including an electrical insulating block part which is configured to incorporate a plurality of signal contacts therein;
a relay wiring substrate mounted to a back of said contact assembly, said relay wiring substrate including, on a surface thereof, a contact connecting pad electrically connected to one of said signal contacts, a wiring connecting pad, and a wiring pattern connecting the contact connecting pad and the wiring connecting pad, said relay wiring substrate further including a ground layer inside said relay wiring substrate; and
a cable connected to said relay wiring substrate by electrically connecting an end of a wiring with the wiring connecting pad;

a ground pattern that is provided on a surface of the relay wiring substrate and includes partitioned patterns extending between the wiring pattern;

and an additional ground pattern matching impedance, situated directly under said one of the signal contacts, which extends from the block part to reach the contact connecting pad.

6. A cable connector, comprising:

a contact assembly including an electrical insulating block part which is configured to incorporate a plurality of signal contacts and a plurality of ground contacts therein;

a relay wiring substrate mounted to a back of said contact assembly, said relay wiring substrate including a ground layer inside said relay wiring substrate, said relay wiring substrate further including:
  a first contact connecting pad electrically connected to one of said signal contacts;
  a first wiring connecting pad;
  a first wiring pattern connecting said first contact connecting pad and said first wiring connecting pad;
  a first ground pattern having a comb shape electrically connected to said ground contact, said first contact connecting pad, said first wiring connecting pad, said first wiring pattern, and said first ground pattern being provided on an upper surface of said relay wiring substrate;
  a second contact connecting pad electrically connected to said signal contact;
  a second wiring connecting pad;
  a second wiring pattern connecting said second contact connecting pad and said second wiring connecting pad; and
  a second ground pattern having a comb shape electrically connected to said ground contact, said second contact connecting pad, said second wiring connecting pad, said second wiring pattern, and said second ground pattern being provided on an under surface of said relay wiring substrate; and a cable connected to said relay wiring substrate, said cable comprising a plurality of shielded pair cables respectively exposing two wirings, one wiring of each of said plurality of shielded pair cables being electrically connected to the first wiring connecting pad of the relay wiring substrate, and another wiring being electrically connected to the second wiring connecting pad of the relay wiring substrate, wherein said relay wiring substrate further includes:
a ground pattern for matching impedance on an upper surface of said relay wiring substrate, situated directly under said one of the signal contacts, which extends from the block part to reach the first contact connecting pad over the first ground pattern; and
another ground pattern for matching impedance on an under surface of said relay wiring substrate, situated directly under said one of the signal contacts, which extends from the block part to reach the second contact connecting pad over the second ground pattern.

7. A cable connector, comprising:

a contact assembly including an electrical insulating block part which is configured to incorporate a plurality of signal contacts and a plurality of ground contacts therein;

a relay wiring substrate mounted to a back of said contact assembly, said relay wiring substrate including a ground layer inside said relay wiring substrate, said relay wiring substrate further including:
  a first contact connecting pad electrically connected to one of said signal contacts;
  a first wiring connecting pad;
  a first wiring pattern connecting said first contact connecting pad and said first wiring connecting pad;
  a first ground pattern having a comb shape electrically connected to said ground contact, said first contact connecting pad, said first wiring connecting pad, said first wiring pattern, and said first ground pattern being provided on an upper surface of said relay wiring substrate;
  a second contact connecting pad electrically connected to said signal contact;
  a second wiring connecting pad;
  a second wiring pattern connecting said second contact connecting pad and said second wiring connecting pad; and
  a second ground pattern having a comb shape electrically connected to said ground contact, said second contact connecting pad, said second wiring connecting pad, said second wiring pattern, and said second ground pattern being provided on an under surface of said relay wiring substrate; and a cable connected to said relay wiring substrate, said cable comprising a plurality of shielded pair cables respectively exposing two wirings, one wiring of each of said plurality of shielded pair cables being electrically connected to the first wiring connecting pad of the relay wiring substrate, and another wiring being electrically connected to the second wiring connecting pad of the relay wiring substrate, wherein the first ground pattern and the second ground pattern of the relay wiring substrate are respectively provided on an upper surface and a lower surface of the relay wiring substrate except positions facing the wirings connected to the relay wiring substrate.

8. A cable connector, comprising:

a contact assembly including an electrical insulating block part which is configured to incorporate a plurality of signal contacts therein;

a relay wiring substrate mounted to a back of said contact assembly, said relay wiring substrate including, on a surface thereof, a contact connecting pad electrically connected to one of said signal contacts, a wiring connecting pad, and a wiring pattern connecting the contact connecting pad and the wiring connecting pad, said relay wiring substrate further including a ground layer inside said relay wiring substrate; and a cable connected to said relay wiring substrate by electrically connecting an end of a wiring with the wiring connecting pad, wherein said relay wiring substrate further includes a ground pattern matching impedance, inside said relay wiring substrate, and wherein said wiring connecting pad includes a groove portion to position said wiring.

9. The cable connector as claimed in claim 3, wherein each of said first wiring connecting pad and said second wiring connecting pad includes a groove portion to position said wiring.

10. The cable connector as claimed in claim 1, wherein said relay wiring substrate further includes a plurality of vias connected to said wiring connecting pad.

11. The cable connector as claimed in claim 3, wherein said relay wiring substrate further includes a plurality of vias connected to the first wiring connecting pad and the second wiring connecting pad.

12. A cable connector, comprising:

a contact assembly including an electrical insulating block part which is configured to incorporate a plurality of signal contacts therein; and a relay wiring substrate mounted to a back of said contact assembly, said relay wiring substrate including, on a surface thereof, a contact connecting pad electrically connected to one of said signal contacts, a wiring connecting pad, and a wiring pattern connecting the contact connecting pad and the wiring connecting pad, said relay wiring substrate further including a ground layer inside said relay wiring substrate and a pair of ground patterns matching impedance, inside said relay wiring substrate, each ground pattern being located on a layer above and below the ground layer, respectively.

* * * * *